United States Patent [19]

Schmidt

[11] 4,326,172

[45] Apr. 20, 1982

[54] TUNABLE ACTIVE HIGH-PASS FILTER

[75] Inventor: Wolfgang Schmidt, Berlin, Fed. Rep. of Germany

[73] Assignee: Robert Bosch GmbH, Stuttgart, Fed. Rep. of Germany

[21] Appl. No.: 163,077

[22] Filed: Jun. 26, 1980

[30] Foreign Application Priority Data

Aug. 3, 1979 [DE] Fed. Rep. of Germany ....... 2931482

[51] Int. Cl.³ ............................................... H03F 1/38
[52] U.S. Cl. .................................... 330/294; 330/306
[58] Field of Search ................. 330/94, 107, 109, 294, 330/305, 306; 331/108 A, 137

[56] References Cited

U.S. PATENT DOCUMENTS 3,525,949  8/1970  Fjällbrant ............................ 330/107

OTHER PUBLICATIONS

Butkus, "Abgleichbare Active Filter und ihre Berechnung", *Funkschau*, 1978, Issue 5, pp. 183, 184.

*Primary Examiner*—James B. Mullins
*Attorney, Agent, or Firm*—Spencer & Kaye

[57] ABSTRACT

A tunable active high-pass filter particularly for use in hearing aids, which comprises merely a transistor as the active amplifying element. Three series-connected capacitors are connected between the input of the filter and the base of the transistor. A first resistor branches off from the junction between the first and second capacitors, a second resistor branches off from the junction between the second and third capacitors, and both resistors are connected, via a third resistor which is adjustable, to the emitter of the transistor which constitutes the output of the filter. A further resistor extends from the junction between the third capacitor and the transistor base to the source of operating potential which, for example, is positive. Preferably, each of the capacitors forms a high-pass filter with its respectively connected resistor with the first and second resistors, i.e. the resistors of the first and second high-pass filters, being located in the positive feedback path between the emitter of the transistor and its base. By the adjustment of only the value of the adjustable resistor, the steepness or slope of the filter can be varied within wide limits.

6 Claims, 2 Drawing Figures

TUNABLE ACTIVE HIGH-PASS FILTER

BACKGROUND OF THE INVENTION

The invention relates to a tunable active high-pass filter. More particularly, the present invention relates to tunable active high pass filter of the type including an amplifying element having resistors and capacitors connected in its positive feedback path with at least one of the resistors being adjustable.

Active filters, which can be balanced, and which contain an operational amplifier as the active amplifying element and utilize positive feedback, are conventional, see for example [Radio Review] 1978, issue 5, pp. 183 and 184. These filters are distinguished in that they make a strict distinction between pass-band and suppression band. However, ordinarily two adjustable resistors (tandem potentiometer) are required for tuning these conventional filters with operational amplifiers.

SUMMARY OF THE INVENTION

The tunable active high-pass filter according to the invention has the initial advantage over the prior art in that only one adjustable resistor is necessary to vary the steepness of the filter within wide limits. Moreover, another essential advantage resides in that the tunable filter according to this invention operates satisfactorily at a value as low as 1.3 V.

The above advantages are achieved according to the present invention in that the tunable active filter comprises: first, second and third series-connected capacitors connected between the input terminal of the filter and the base of a transistor, which constitutes the active amplifying element of the filter; a positive feedback path including a first resistor connected between the junction of the first and second capacitors and a common point, a second resistor connected between the junction of the second and third capacitors and the common point, and a third resistor connected between the common point and a terminal of the transistor which constitutes the output of the filter; and, a fourth resistor connected between the junction of the third capacitor and the base of the transistor, and a source of operating potential.

Through the use of various other features of the invention, advantageous further developments and improvements of the tunable active high-pass filter according to the invention, as set forth above, are made possible. For example, it is especially advantageous to dimension the resistance value of the resistor connected between the base of the transistor and the source of operating potential in such a way that it constitutes, together with the one of the capacitors connected to the transistor base, an RC-high-pass filter while simultaneously determining the operating point of the transistor. Thus, this resistor executes a dual function.

DESCRIPTION OF THE PREFERRED EMBODIMENTS

Figure 1:
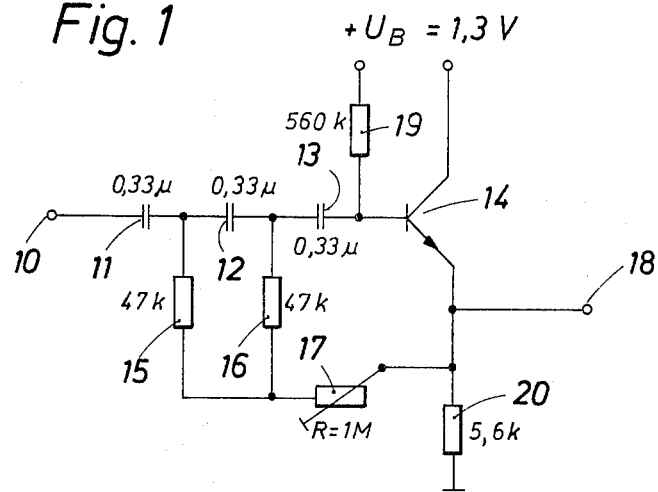
FIG. 1 is a circuit diagram of a preferred embodiment of a tunable active high-pass filter according to the invention and FIG. 2 is a family of curves showing the dependency between attenuation and frequency for various resistance values of the adjustable resistor of the circuit of FIG. 1.

A tunable active high-pass filter according to the invention comprises, according to FIG. 1, a filter input 10 connected via three series-connected capacitors 11, 12, and 13 to the base of a transistor 14 which constitutes the active amplifying element of the filter. A first resistor 15 is connected to the junction point of the first and second capacitors 11 and 13, respectively, and a resistor 16 is connected to the junction point of the second and third capacitors 12 and 13, respectively. The resistors 15 and 16 are connected together at a common point and then to the emitter of transistor 14 via a third, adjustable resistor 17. The emitter of the transistor 14 simultaneously constitutes the output 18 of the high-pass filter.

A fourth resistor 19 branches off from the junction of the third capacitor 13 and the base of transistor 14. This fourth resistor 19, is connected to a fixed reference potential which is, for example, the positive potential $+V_B$ of the operating voltage source. The dimentioning of the resistor 19 is preferably such that it forms a RC-high-pass filter with the capacitor 13 while simultaneously setting the operating point of the transistor 14. While the collector of the transistor 14 is likewise connected to the operating voltage source, the emitter of transistor 14 is connected via an emitter resistor 20 to a point of reference potential e.g., ground.

The mode of operation of the above-described circuit is as follows.

When a signal voltage comprising low and high frequencies is fed to the input 10 of the filter, the low frequencies are attenuated by the RC-circuits 11-15, 12-16 and 13-19 which each form a respective high-pass filter, while the high frequencies remain extensively unaffected. Due to the presence of the transistor 14 and a positive feedback path leading from the emitter of transistor 14 via the third resistor 17 and the high-pass filters to the base of the transistor 14, the transition between the supression band and the pass-band is made steeper.

Figure 2:
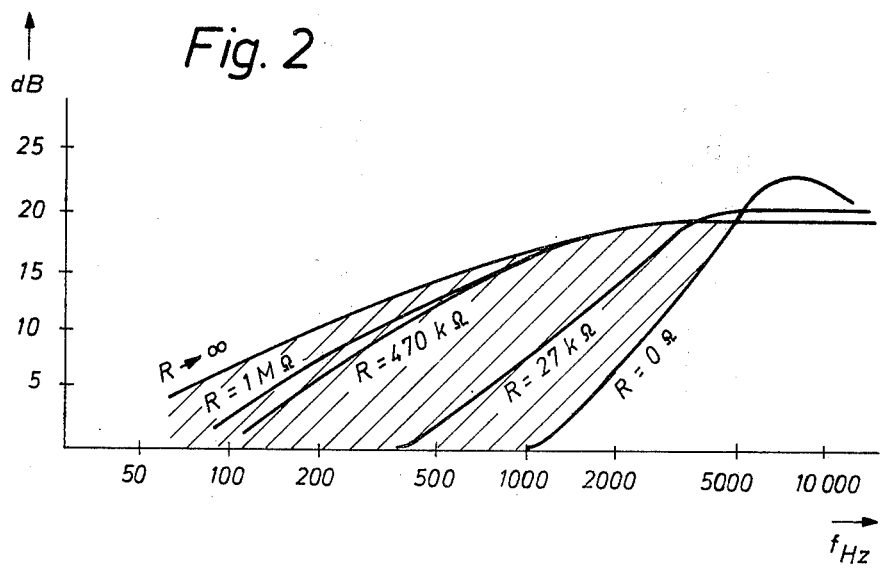

The slope or steepness of the active high-pass filter characteristic can be changed by varying the resistance value of the third resistor 17 as shown in FIG. 2. With the dimensioning of the various components as indicated in FIG. 1, the maximum edge slope or steepness is obtained at a resistance value of the resistor 17 of zero ohm. The edge steepness, which is reduced with an increasing resistance value, does not represent an impairment for the use of the filter in hearing aids.

The adjustable resistor 17 is preferably of the type which exhibits a resistance value of zero at one end position and the resistance value infinity at the other end position. The resistance value infinity is realized in such a resistor by providing an interruption between the end of the resistance path and the associated terminal.

The transistor 14 employed should be a transistor of maximally high current amplification.

It is to be understood that the above description of the present invention is susceptible to various modifications, changes and adaptations, and the same are intended to be comprehended within the meaning and range of equivalents of the appended claims.

What is claimed:

1. A tunable active high-pass filter comprising in combination: a transistor amplifying element, an input terminal for said filter; first, second and third series-connected capacitors connected between said input terminal of said filter and the base of said transistor; and a positive feedback path for said transistor including a first resistor connected between the junction point of said first and second capacitors and a common junction point, a second resistor connected between the junction point of said second and third capacitors and said common junction point, and a third, adjustable resistor connected between said common junction point and a terminal of said transistor which constitutes the output of said filter; and a fourth resistor connected between the junction point of said third capacitor and said base of said transistor and a source of fixed operating voltage.

2. A tunable active high-pass filter as defined in claim 1, wherein the resistance value of said fourth resistor is dimensioned such that said fourth resistor together with said third capacitor constitute and RC-high-pass filter and said fourth resistor simultaneously determines the operating point of said transistor.

3. A tunable active high-pass filter as defined in claim 1 or claim 2, wherein said third, adjustable resistor exhibits the resistance value zero at one end position and the resistance value infinity at the other end position.

4. A tunable active high pass filter as defined in claim 1 or claim 2, wherein said first resistor and said first capacitor form an R-C high pass filter, and said second resistor and said second capacitor form and RC high pass filter.

5. A tunable active high pass filter as defined in claim 1 or claim 2 wherein: said terminal of said transistor is the emitter; a further resistor is connected between the point of connection of said emitter and said third resistor and a point of reference potential; and the collector of said transistor is connected to said source of fixed operating voltage.

6. A tunable active high pass filter as defined in claim 3 wherein: said terminal of said transistor is the emitter; a further resistor is connected between the point of connection of said emitter and said third resistor and a point of reference potential; and the collector of said transistor is connected to said source of fixed operating voltage.

* * * * *